United States Patent
Ji

(10) Patent No.: US 11,087,071 B2
(45) Date of Patent: Aug. 10, 2021

(54) SELF-COMPRESSED YANG MODEL

(71) Applicant: Ciena Corporation, Hanover, MD (US)

(72) Inventor: Xiang Ji, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 16/683,993

(22) Filed: Nov. 14, 2019

(65) Prior Publication Data
US 2021/0149987 A1 May 20, 2021

(51) Int. Cl.
G06F 16/00 (2019.01)
G06F 40/12 (2020.01)
H03M 7/30 (2006.01)
G06F 40/40 (2020.01)
G06F 16/22 (2019.01)

(52) U.S. Cl.
CPC .............. *G06F 40/12* (2020.01); *G06F 16/00* (2019.01); *G06F 16/2228* (2019.01); *G06F 40/40* (2020.01); *H03M 7/3059* (2013.01); *H03M 7/6011* (2013.01)

(58) Field of Classification Search
CPC .............................. G06F 16/00; G06F 16/2228
See application file for complete search history.

(56) References Cited

U.S. PATENT DOCUMENTS

| | | | |
|---|---|---|---|
| 7,415,480 B2 * | 8/2008 | Borthakur | ........... G06F 16/1734 |
| 8,838,653 B2 * | 9/2014 | Athreya | ................ G06F 16/214 |
| | | | 707/803 |
| 10,455,300 B2 | 10/2019 | Swinkels et al. | |
| 10,516,761 B1 * | 12/2019 | A | ............................ H04L 41/12 |
| 2011/0145286 A1 * | 6/2011 | LaRowe | ........... G06F 16/90335 |
| | | | 707/780 |
| 2016/0350095 A1 * | 12/2016 | Ramachandran | ... H04L 41/0213 |
| 2017/0099332 A1 * | 4/2017 | Bullotta | .................. H04L 69/10 |
| 2017/0187577 A1 * | 6/2017 | Nevrekar | ............ H04L 41/0226 |
| 2018/0359133 A1 | 12/2018 | Shew et al. | |
| 2019/0121880 A1 * | 4/2019 | Scherer, III | ........... G06F 16/258 |
| 2019/0208296 A1 | 7/2019 | Vanderydt et al. | |

OTHER PUBLICATIONS

Burtscher et al., "Real-Time Synthesis of Compression Algorithms for Scientific Data," SC16; Salt Lake City, Utah, USA; Nov. 2016, pp. 1-12. (Year: 2016).*

(Continued)

*Primary Examiner* — Amelia L Tapp
(74) *Attorney, Agent, or Firm* — Clements Bernard Walker; Lawrence A. Baratta, Jr.; Christopher L. Bernard

(57) ABSTRACT

Systems and methods for a self-compressed YANG (Yet Another Next Generation) model allow a model data provider (e.g., a client that provides configuration information to a server, or a server that provides response data to a query) to dynamically select either text format or compressed format using the same data model. This approach can significantly increase the YANG management performance of both network elements and servers (e.g., Operations, Administration, and Maintenance (OAM) devices). The self-compressed YANG model maintains full compatibility to existing standards/implementations, namely, the enhanced compression is available where supported.

18 Claims, 6 Drawing Sheets

(56) References Cited

OTHER PUBLICATIONS

"ConfD User Guide, Tail-f Systems" Mar. 21, 2017, "Chapter 3 The YANG Data Modeling Language" pp. 1-37, retrieved from http://66.218.245.39/doc/html/ch03.html. (Year: 2017).*

"ConfD User Guide, Tail-f Systems" Mar. 21, 2017, "Table of Contents" pp. 1-11, retrieved from http://66.218.245.39/doc/html/ch03.html. (Year: 2017).*

"ConfD Basic, Tail-f Systems" pp. 1-4, retrieved from http://66.218.245.39/doc/html/ch03.html on Feb. 1, 2021. (Year: 2021).*

M. Bjorklund, Yang—A Data Modeling Language for the Network Configuration Protocol (NETCONF), Internet Engineering Task Force (IETF), Standards Track, ISSN: 2070-1721, Oct. 2010, pp. 1-173.

M. Bjorklund, The YANG 1.1 Data Modeling Language, Internet Engineering Task Force (IETF), Standards Track, ISSN: 2070-1721, Aug. 2016, pp. 1-217.

* cited by examiner

SELF-COMPRESSED YANG MODEL

FIELD OF THE DISCLOSURE

The present disclosure generally relates to networking. More particularly, the present disclosure relates to systems and methods for a self-compressed YANG (Yet Another Next Generation) model.

BACKGROUND OF THE DISCLOSURE

RFC 6020, "YANG—A Data Modeling Language for the Network Configuration Protocol (NETCONF)," October 2010, and RFC 7950, "The YANG 1.1 Data Modeling Language," August 2016, the contents of each are incorporated herein by reference, describe the YANG model as a data modeling language to model configuration data, operation data, and Remote Procedure Calls (RPC). YANG is a data modeling language for the definition of data sent over network management protocols such as the NETCONF and RESTCONF. YANG can include Extensible Markup Language (XML), JavaScript Object Notation (JSON), etc. formatted as a data model to provide a text format Operations, Administration, and Maintenance (OAM) interface, to configure and monitor network devices. However due to the text, i.e., human-readable format, the efficiency is very low when it is used to control or monitor a major network device, such as a core internet router or Multiprotocol Label Switching (MPLS) switch. For example, in an Internet Protocol (IP) router, each router needs a forwarding entry "outgoing-interface" attribute, and, when the number of IP routes reaches a high number, a router could have more than 100,000 router entries in the routing table. A YANG model-based configure or query needs to repeat the XML text "<outgoing-interface>name</outgoing-interface>" for 100,000 times or more just for this single attribute. This significantly wastes both network bandwidth to transmit this data and processor capability, which slows down the device, making the model less possible to be deployed for many applications, including telemetry, which needs to monitor the device periodically.

YANG model NETCONF/RESTCONF performance issues are a major drawback compared to prior Management Information Base (MIB)/Simple Network Management Protocol (SNMP) solutions. This impacts the YANG model applicability on high-end network devices, it can extend device restart time, cause slow user query response, and high processor and network utilization.

BRIEF SUMMARY OF THE DISCLOSURE

The present disclosure relates to systems and methods for a self-compressed YANG (Yet Another Next Generation) model. The self-compressed YANG model maintains full compatibility to existing standards/implementations, namely, the enhanced compression is available where supported. The self-compressed YANG model allows a model data provider (e.g., a client that provides configuration information to a server, or a server that provides response data to a query) to dynamically select either text format or compressed format using the same data model. Advantageously, this approach can significantly increase the YANG management performance of both network elements and servers (e.g., Operations, Administration, and Maintenance (OAM) devices). For example, this can reduce the NETCONF/RESTCONF data volume as much as 85% or more, in terms of network traffic.

In an embodiment, a method and a non-transitory computer-readable medium includes instructions stored thereon for programming a processing device to perform steps of obtaining data for modeling via a Yet Another Next Generation (YANG) model; encoding the data in a text format; compressing the text format into compressed binary data; and transmitting the compressed binary data for the YANG model to a receiving device. The compressing can be performed based on a number of items that are repeated. The compressing can be performed when the text format is on an order of megabytes in size. The steps can further include grouping the text format in the YANG model; and creating a binary type and injecting the compressed binary data in the YANG model, such that the text format or the compressed binary data are stored in a same model. The YANG model can further specify a compression format for the compressed binary data. The steps can further include obtaining second data for modeling via the YANG model, wherein the second data is smaller than the data; encoding the second data in the text format; and transmitting the text format for the YANG model to the receiving device. The data can be any of configuration data and operational data for a network element.

In another embodiment, a data generating device includes a processor and memory storing instructions that, when executed, cause the processor to obtain data for modeling via a Yet Another Next Generation (YANG) model, encode the data in a text format, compress the text format into compressed binary data, and transmit the compressed binary data for the YANG model to a receiving device. The text format can be compressed based on a number of items that are repeated. The text format can be compressed when the text format is on an order of megabytes in size. The instructions that, when executed, can further cause the processor to group the text format in the YANG model, and create a binary type and inject the compressed binary data in the YANG model, such that the text format or the compressed binary data are stored in a same model with different built-in types. The YANG model can further specify a compression format for the compressed binary data. The instructions that, when executed, can further cause the processor to obtain second data for modeling via the YANG model, wherein the second data is smaller than the data, encode the second data in the text format, and transmit the text format for the YANG model to the receiving device. The data can be any of configuration data and operational data for a network element.

In a further embodiment, a receiving device includes a processor and memory storing instructions that, when executed, cause the processor to receive Yet Another Next Generation (YANG) model data from a data generating device, determine whether YANG model data is in a text format or a compressed binary data, responsive to the YANG model data being in the text format, process the text format, and responsive to the YANG model data being in the compressed binary data, decompress the compressed binary data to obtain the text format and process the text format. The text format in the compressed binary data can be compressed by the data generating device based on a number of items that are repeated. The text format in the compressed binary data can be compressed when the text format is on an order of megabytes in size. The YANG model can further specify a compression format for the compressed binary data. The YANG model data can include the compressed binary data, and wherein the instructions that, when executed, can further cause the processor to receive second YANG model data from the data generating device, wherein the second YANG model data is smaller than the YANG model data, and wherein the second YANG model data is in the text format. The data can be any of configuration data and operational data for a network element.

BRIEF DESCRIPTION OF THE DRAWINGS

The present disclosure is illustrated and described herein with reference to the various drawings, in which like reference numbers are used to denote like system components/method steps, as appropriate, and in which:

FIG. 2 is a block diagram of a processing device which can form a controller for the network element of FIG. 1, a Network Management System (NMS), an Element Management System (EMS), a Software-Defined Networking (SDN) controller, or the like;

DETAILED DESCRIPTION OF THE DISCLOSURE

Again, the present disclosure relates to systems and methods for a self-compressed YANG (Yet Another Next Generation) model. The self-compressed YANG model maintains full compatibility to existing standards/implementations, namely, the enhanced compression is available where supported. The self-compressed YANG model allows a model data provider (e.g., a client that provides configuration information to a server, or a server that provides response data to a query) to dynamically select either text format or compressed format using the same data model. Advantageously, this approach can significantly increase the YANG management performance of both network elements and servers (e.g., Operations, Administration, and Maintenance (OAM) devices). For example, this can reduce the NETCONF/RESTCONF data volume as much as 85% or more, in terms of network traffic. The present disclosure contemplates any compression tools and compression formats to reduce the amount of data to be transmitted significantly.

Example Network Element/Node

Figure 1:
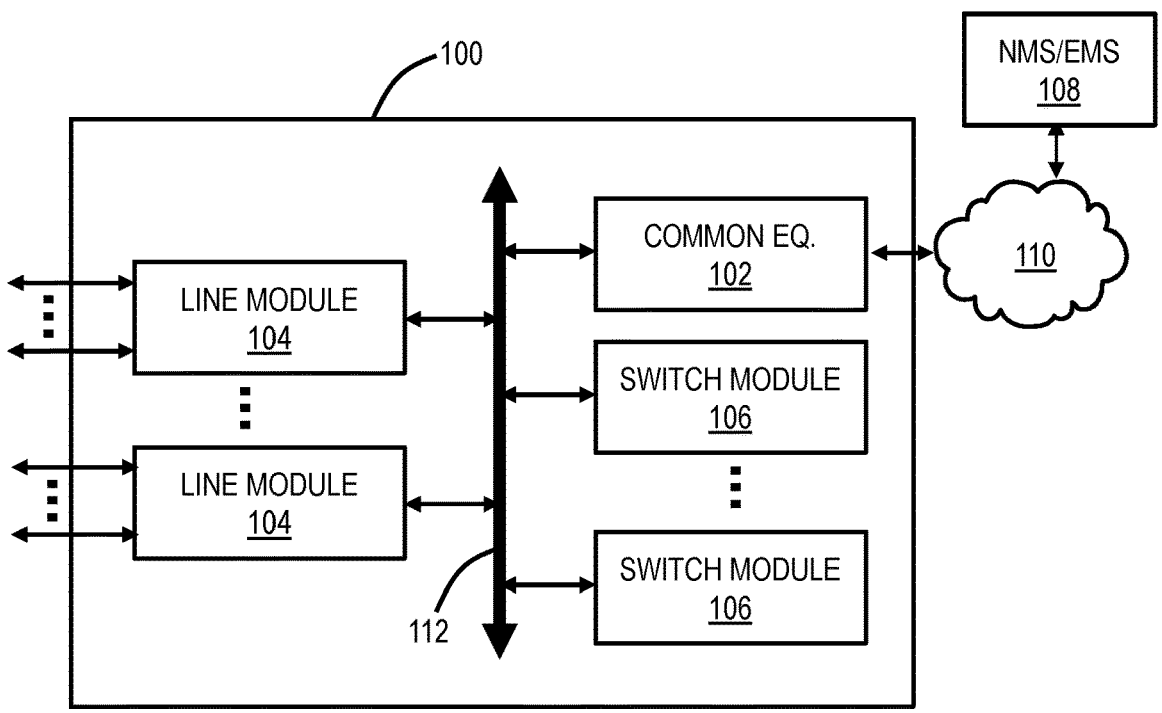
FIG. 1 is a block diagram of an example network element for use with the systems and methods described herein.

FIG. 1 is a block diagram of an example network element 100 (node) for use with the systems and methods described herein. In an embodiment, the network element 100 can be a device that may consolidate the functionality of an Internet Router, a Multiprotocol Label Switching (MPLS) router or switch, a Multi-Service Provisioning Platform (MSPP), Digital Cross-Connect (DCS), Ethernet and/or Optical Transport Network (OTN) switch, Wave Division Multiplexed (WDM)/DWDM platform, Packet Optical Transport System (POTS), etc. into a single, high-capacity intelligent switching system providing Layer 0, 1, 2, and/or 3 consolidation. In another embodiment, the network element 100 can be any of an OTN Add/Drop Multiplexer (ADM), a Multi-Service Provisioning Platform (MSPP), a Digital Cross-Connect (DCS), an optical cross-connect, a POTS, an optical switch, a router, a switch, a WDM/DWDM terminal, an access/aggregation device, a wireless base station, etc. That is, the network element 100 can be any digital, wireless (Radio Frequency (RF)), and/or optical system with ingress and egress digital, wireless, and/or optical signals, including switching of channels, timeslots, tributary units, wavelengths, etc. Also, the network element 100 may be a physical device as well as a virtual device (e.g., Virtual Network Function (VNF)).

In an embodiment, the network element 100 includes common equipment 102, one or more line modules 104, and one or more switch modules 106. The common equipment 102 can include power; a control module; Operations, Administration, Maintenance, and Provisioning (OAM&P) access; user interface ports; and the like. The common equipment 102 can connect to a management system 108 through a data communication network 110. Those of ordinary skill in the art will recognize the network element 100 can communicate with other network elements 100, with other devices, such as, without limitation, a Software-Defined Networking (SDN) controller, an orchestrator, a Network Management System (NMS), and Element Management System (EMS), etc.

Additionally, the common equipment 102 can include a controller, such as a controller 200 illustrated in FIG. 1 configured to perform OAM&P functions, operate a control plane, etc. The network element 100 can include an interface 112 for communicatively coupling the common equipment 102, the line modules 104, and the switch modules 106 to one another. For example, the interface 112 can be a backplane, midplane, a bus, optical and/or electrical connectors, or the like. The line modules 104 are configured to provide ingress and egress to the switch modules 106 and to external connections on the links to/from the network element 100. In an embodiment, the line modules 104 can form ingress and egress switches with the switch modules 106 as center stage switches for a three-stage switch, e.g., a three-stage Clos switch. Other configurations and/or architectures are also contemplated.

Further, the line modules 104 can include a plurality of optical connections per module, and each module may include flexible rate support for any type of connection. The line modules 104 can include WDM interfaces, short-reach interfaces, and the like, and can connect to other line modules 104 on remote network elements, end clients, edge routers, and the like, e.g., forming connections on the links in a network. From a logical perspective, the line modules 104 provide ingress and egress ports to the network element 12, and each line module 104 can include one or more physical ports. The switch modules 106 are configured to switch channels, timeslots, tributary units, packets, etc. between the line modules 104. For example, the switch modules 106 can provide wavelength granularity (Layer 0 switching); OTN granularity; Ethernet granularity; and the like. Specifically, the switch modules 106 can include Time Division Multiplexed (TDM) (i.e., circuit switching) and/or packet switching engines. The switch modules 106 can include redundancy as well, such as 1:1, 1:N, etc.

Those of ordinary skill in the art will recognize the network element 100 can include other components which are omitted for illustration purposes, and that the systems and methods described herein are contemplated for use with a plurality of different network elements with the network element 100 presented as an example type of network element. For example, in another embodiment, the network element 100 may not include the switch modules 106, but rather have the corresponding functionality in the line modules 104 (or some equivalent) in a distributed fashion. Also, the network element 100 may omit the switch modules 106 and that functionality, such as in a Dense Wave Division Multiplexing (DWDM) terminal. Further, in another embodiment, the network element 100 may omit modules altogether and be physically formed in an integrated chassis, such as a so-called "pizza box." Even further, the network element 100 may include pluggable modules as well.

In general, the systems and methods described herein contemplate use with any network element, and the network element 100 is merely presented as an example for the systems and methods described herein. That is, the network element 100 can be a server for YANG models, exchanging such models with other network elements, with clients, and the like. That is, in a typical OAM scenario, network devices are servers and the management systems are clients.

Example Controller

Figure 2:
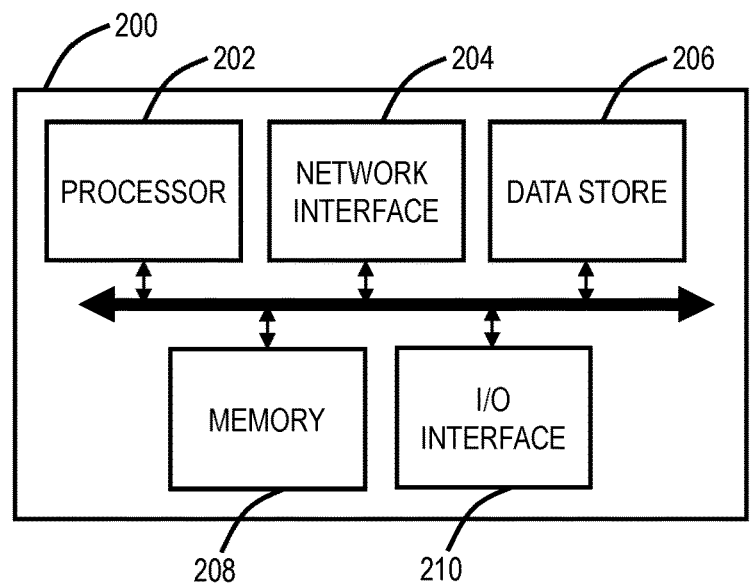

FIG. 2 is a block diagram of a processing device 200, which can form a controller for the network element 100, an NMS, an EMS, an SDN controller, the management system 108, or the like. The processing device 200 can be part of the common equipment, such as common equipment 102 in the network element 100, or a stand-alone device communicatively coupled to the network element 100 via the data communication network 110. In a stand-alone configuration, the processing device 200 can be the management system 108, a PCE, etc. Also, the processing device 200 can be a virtual device such as a Virtual Machine (VM) or an application on a VM. The processing device 200 can include a processor 202 which is a hardware device for executing software instructions such as operating the control plane. The processor 202 can be any custom made or commercially available processor, a central processing unit (CPU), an auxiliary processor among several processors associated with the controller 200, a semiconductor-based microprocessor (in the form of a microchip or chipset), or generally any device for executing software instructions. When the processing device 200 is in operation, the processor 202 is configured to execute software stored within the memory, to communicate data to and from the memory, and to generally control operations of the processing device 200 pursuant to the software instructions. The processing device 200 can also include a network interface 204, a data store 206, memory 208, an I/O interface 210, and the like, all of which are communicatively coupled to one another and to the processor 202.

The network interface 204 can be used to enable the processing device 200 to communicate on the data communication network 110, such as to communicate YANG model information to other devices, to the management system 108, to the network elements 100, and the like. The network interface 204 can include, for example, an Ethernet module. The network interface 204 can include address, control, and/or data connections to enable appropriate communications on the network. The data store 206 can be used to store data, such as control plane information, provisioning data, OAM&P data, etc. The data store 206 can include any of volatile memory elements (e.g., random access memory (RAM, such as DRAM, SRAM, SDRAM, and the like)), nonvolatile memory elements (e.g., ROM, hard drive, flash drive, CDROM, and the like), and combinations thereof. Moreover, the data store 206 can incorporate electronic, magnetic, optical, and/or other types of storage media. The memory 208 can include any of volatile memory elements (e.g., random access memory (RAM, such as DRAM, SRAM, SDRAM, etc.)), nonvolatile memory elements (e.g., ROM, hard drive, flash drive, CDROM, etc.), and combinations thereof. Moreover, the memory 208 may incorporate electronic, magnetic, optical, and/or other types of storage media. Note that the memory 208 can have a distributed architecture, where various components are situated remotely from one another, but may be accessed by the processor 202. The I/O interface 210 includes components for the controller 200 to communicate with other devices. Further, the I/O interface 210 includes components for the processing device 200 to communicate with the other network elements 100, such as using overhead or the like.

The processing device 200 is configured to implement software, processes, algorithms, etc. that can control configurable features of a network, such as automating discovery of the network elements 100, capacity on the links, port availability on the network elements 100, connectivity between ports; dissemination of topology and bandwidth information between the network elements 100; path computation and creation for connections; network-level protection and restoration; monitor operational status of the network elements 100; and the like.

YANG Model

Again, YANG is a data modeling language used primarily to describe devices, e.g., the network elements 100, specifically, configuration and state information. YANG is used to model network devices and services, which are then transported via the NETCONF protocol. YANG's strength is in configuring networking devices. For example, a device such as a router can be modeled in YANG, then configured via the NETCONF protocol. The configuration is plain text and human-readable. It is easy to copy and paste and compare across other configurations. For example, YANG can be used to define interfaces for configuring individual Virtual Network Functions (VNFs) in a Network Functions Virtualization (NFV) environment.

YANG is proving relevant beyond its initial confines, as bindings to other interfaces (e.g., RESTCONF [RFC8040]) and encoding other than XML (e.g., JSON) are being defined. Furthermore, YANG data models can be used as the basis of implementation for other interfaces, such as Command Line Interface (CLI) and programmatic Application Programming Interfaces (APIs). For example, YANG data models can be used for optical interfaces (DWDM, Forward Error Correction (FEC), etc.), Traffic Engineering (TE) Tunnels, Label Switched Paths (LSPs) and TE interfaces that cover data applicable to generic or device-independent, device-specific, Multiprotocol Label Switching (MPLS) technology-specific, and Segment Routing (SR) TE technology, and the like.

Self-Compressed YANG Model

The self-compressed YANG model enables storing both compressed data and the original, uncompressed data in the same YANG data model, and with the compressed data fully under control of the model header. In particular, the self-compressed YANG model can use a binary built-in type to allow the compressed text format XML/JSON data to be encapsulated back into the same YANG model. For example, Sec. 4.2.4 of RFC 6020 defines the built-in types for YANG, including a binary type that supports "any binary data." Thus, a compressed version of any YANG data model can be stored in the same YANG data model under a binary built-in type. Again, the YANG model can be used for either or both of configuration data and operational data.

Figure 3:
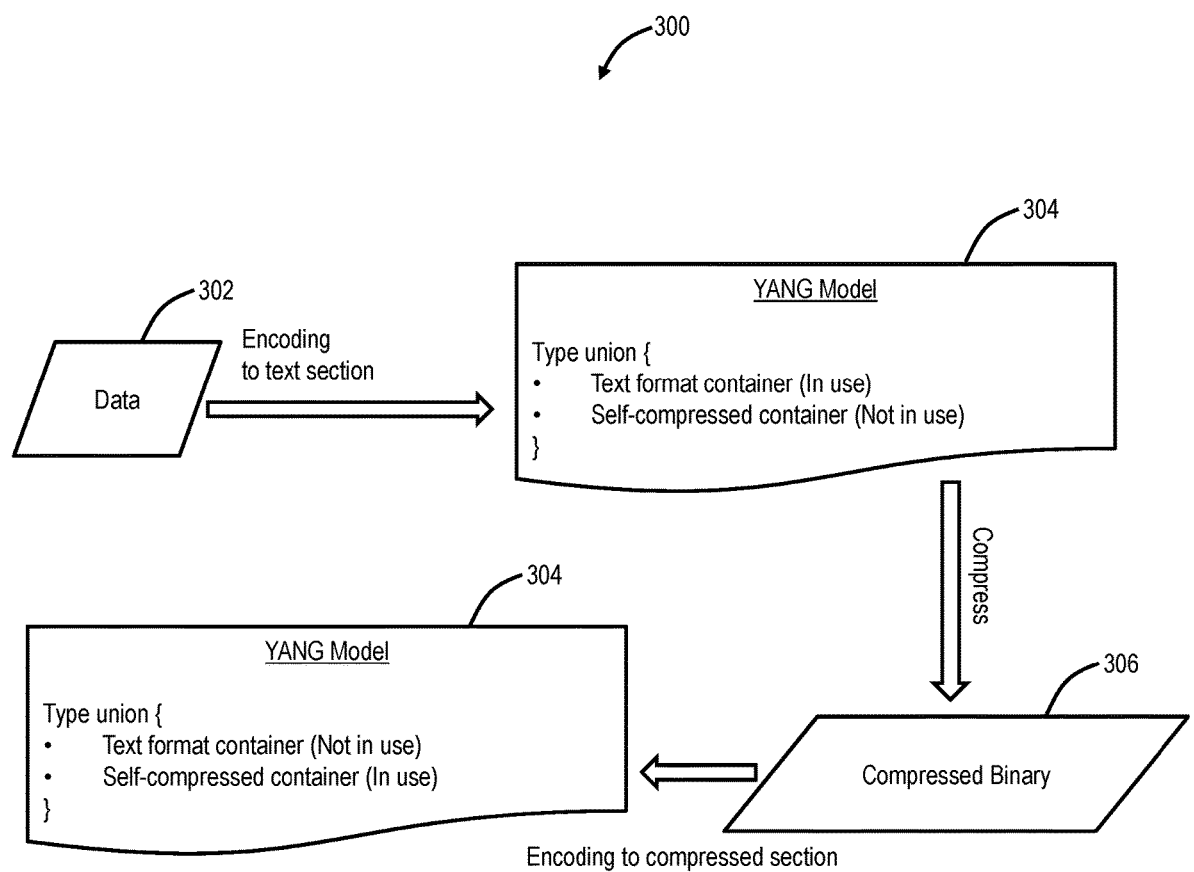
FIG. 3 is a flow diagram of a process for text format and compressed format YANG encoding

FIG. 3 is a flow diagram of a process 300 for text format and compressed format YANG encoding. As an example, to enable self-compressed support for any existing YANG model, the following steps in FIG. 3 can be performed. First, data 302 (e.g., configuration data, operational data, etc.) for a YANG model 304 can be encoded to a text section of the YANG model 304, e.g., the text format container. The present disclosure can utilize the union built-in type, such as in Sec. 9.12 of RFC 6020. The YANG model 304 can include a binary type to store the compressed format data, and compress format information, and compressed binary data 306 can be injected into the same YANG model 304. The union type is one of the implementation examples, the multiple modeling iteration can also be implemented in many other ways, including extending the YANG standard to assign a dedicated keyword; or, have both text format data part and binary format data part with a flag as an indication that which part is in use.

Of note, the present disclosure can utilize other techniques to define the compressed binary data 306. The following are some examples:

Example technique 1. declare a container

```
container self-compressed {
    leaf compress-format {
        type string;
        description
            "format used to generate the binary compressed data";
    leaf compress-data {
        type binary;
        description
            "compressed data";
}
```

Example technique 2. declare a union to wrap up both original data and the above binary data shown up in example technique 1.

Example technique 3. use augment to extend the existing model to support self-compressed data shown up in example technique 1.

Example technique 4. To extend the YANG model language to define a new keyword to do the same thing in example technique 1 or example technique 2.

Self-Compressed YANG Model Processes

As described herein, the self-compressed YANG model is exchanged (transmitted) between two devices, e.g., the network elements 100, the management system 108, the processing device 200, a VNF, an NMS, an EMS, an SDN controller, an orchestrator, etc. For terminology, a data generator device (or data provider) is used to denote a sending device and a receiving device is used to denote a receiving device. Those of ordinary skill in the art will recognize that any device can be either a data generator device and/or a receiving device.

The data generator device can dynamically select either to use the compressed format or not without changing anything on the receiver side. For example, when the total number of a list is relatively small, the human-readable text format is selected, when the total number of elements/members in a list is relatively large, then compressed format is used. This dynamic selection can happen at any time, without restarting the existing session. The small and large can refer to the number of the elements repeated in a list instead of the size of each individual element. For example, modeled data for a list is sent, when the number of element in list is less than 100 items, which can be treated as small, the number of list elements 1000 can be treated as large. In a YANG model, every list element needs a common modeling overhead. For example, in the network interface list example, "<outgoing-interface>" and "</outgoing-interface>" is to be repeated for every device interface element, the compress mode works more efficient when the list size is bigger, where this kind of duplicate text format pattern repeats many times. Compression techniques can detect repeat partterns and use much short binary coding for higher frequent patterns.

Figure 4:
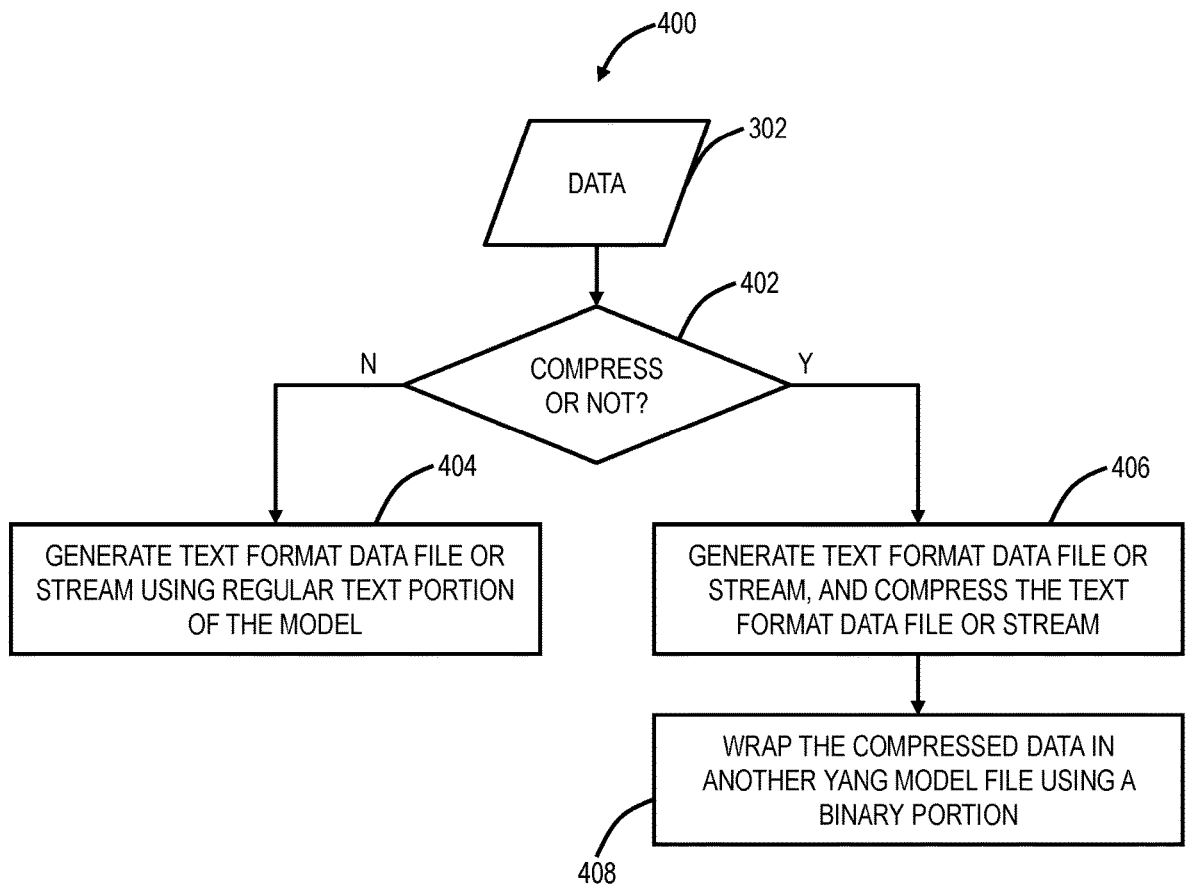
FIG. 4 is a self-compressed YANG model process describing modeled data creation.

FIG. 4 is a flowchart of a self-compressed YANG model process 400 describing modeled data creation. The self-compressed YANG model process 400 is performed by the data generator device and includes the data 302. The self-compressed YANG model process 400 can be performed when the data generator device is required to generate an XML/JSON YANG model data file, e.g., a client that wants to provide configuration data or operational data to a server, or where a server wants to provide a response to a query.

The data generator device can determine whether or not to compress the data 302 (step 402). For example, the data generator device can determine not to compress the data 302 if the data 302 is relatively small. Also, the data generator device can determine not to compress the data 302 if the receiving device does not support compression. When the data generator device determines not to compress (step 402), the data 302 is generated in a text format data file or stream as usual, using the regular text portion of the YANG model 304 (step 404).

The data generator device can determine to compress the data 402, such as when the data is relatively large (and when the receiving device supports compression). If the data generator device decides to use the compressed format, it generates the text format data file or stream, and compresses the text format data file or stream (step 406) and wraps up the result with another XML/JSON model file with the same model using the compressed binary type (step 408). For example, when using a self-compressed YANG model implemented with example format technique 1, the "zip" format compressed data is composed into the container of "self-compressed":

```
<self-compressed>
    <compress-format> zip </compress-format>
    <compress-data> [The ZIP compressed binary data]
    </compress-data>
</self-compressed >
```

Figure 5:
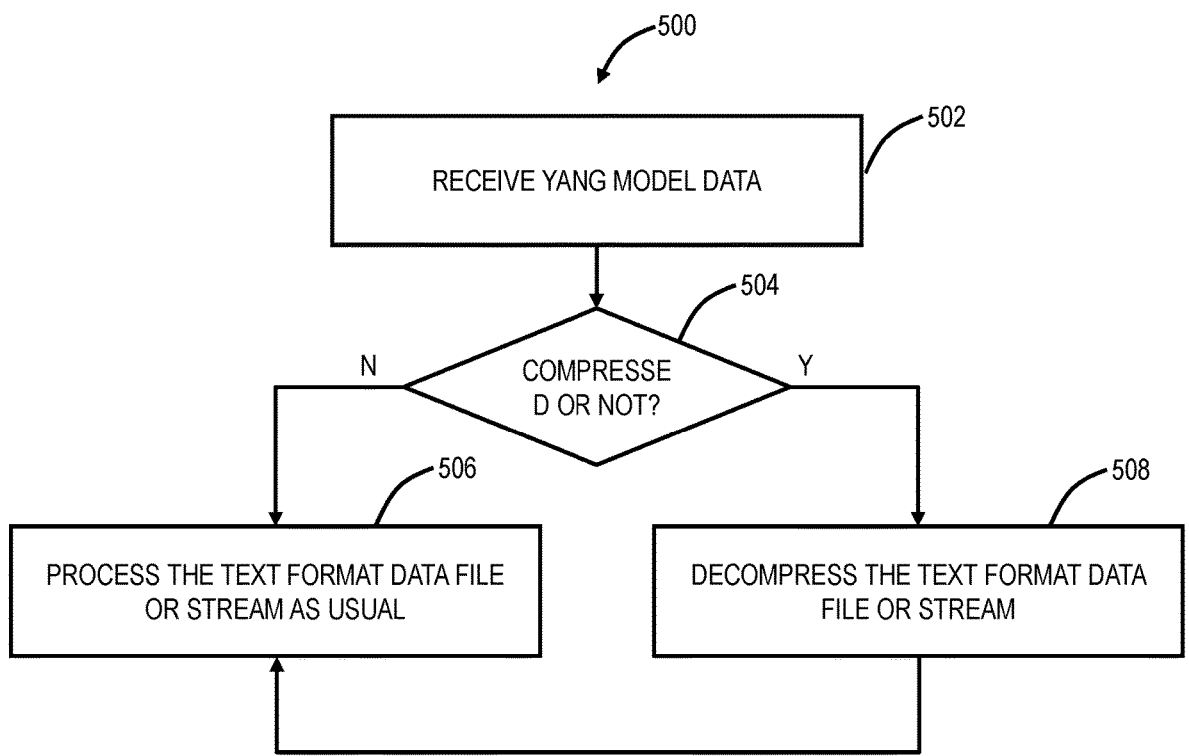
FIG. 5 is a flowchart of a self-compressed YANG model process describing operations at a receiving device.

FIG. 5 is a flowchart of a self-compressed YANG model process 500 describing operations at a receiving device. The self-compressed YANG model process 500 includes receiving YANG model data (step 502). When the received YANG model data is in a text format (step 504), the receiving device processes the text format data file or stream as usual (step 506). When the received data is in a compressed format (step 504), the receiving device decompresses it with the specified data compression format (the specified data compression format can be noted during step 406), then re-reads the decompressed data as input (step 506). In the above example, the uncompressed data is a regular human-readable text formatted YANG encoding file or stream, after that, the self-compressed container in the model is empty now and the rest of data can be used as usual.

When text format XML or JSON encoding files or streams are compressed, there is typically an 85~95% size reduction for large or medium size data of a YANG model list. This significantly improves performance.

Figure 6:
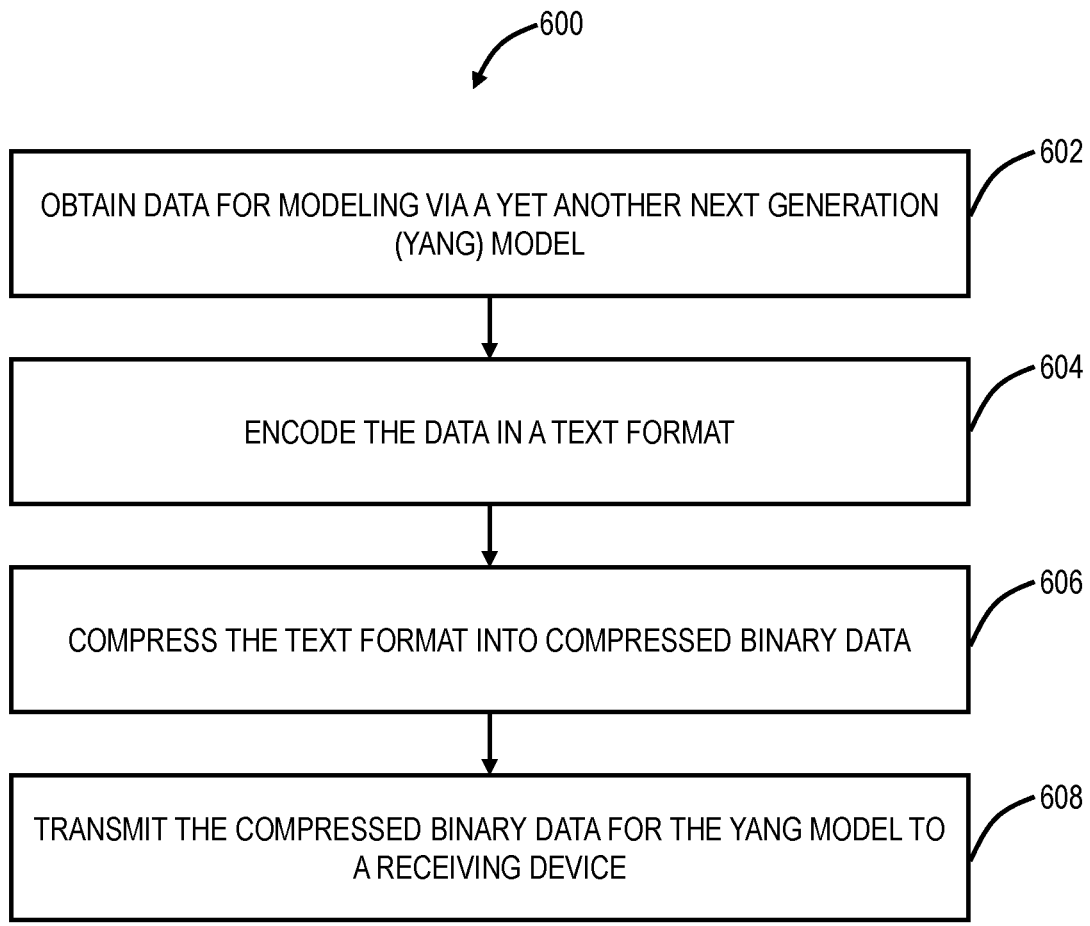
FIG. 6 is a flowchart of a process implemented at a data generating device.

FIG. 6 is a flowchart of a process 600 implemented at a data generating device. The process 600 includes obtaining data for modeling via a Yet Another Next Generation (YANG) model (step 602), encoding the data in a text format (step 604), compressing the text format into compressed binary data (step 606), and transmitting the compressed binary data for the YANG model to a receiving device.

The text format can be compressed based on a size of the text format. For example, the text format is compressed when the text format is on an order of megabytes in size. The data can be any of configuration data and operational data for a network element.

The process 600 can also include grouping the text format in the YANG model and creating a binary type and injecting the compressed binary data in the YANG model, such that the text format or the compressed binary data are stored in a same model with different built-in types. The YANG model can further specify a compression format for the compressed binary data.

The process 600 can also include obtaining second data for modeling via the YANG model, wherein the second data is smaller than the data, encoding the second data in the text format, and transmitting the text format for the YANG model to the receiving device.

Figure 7:
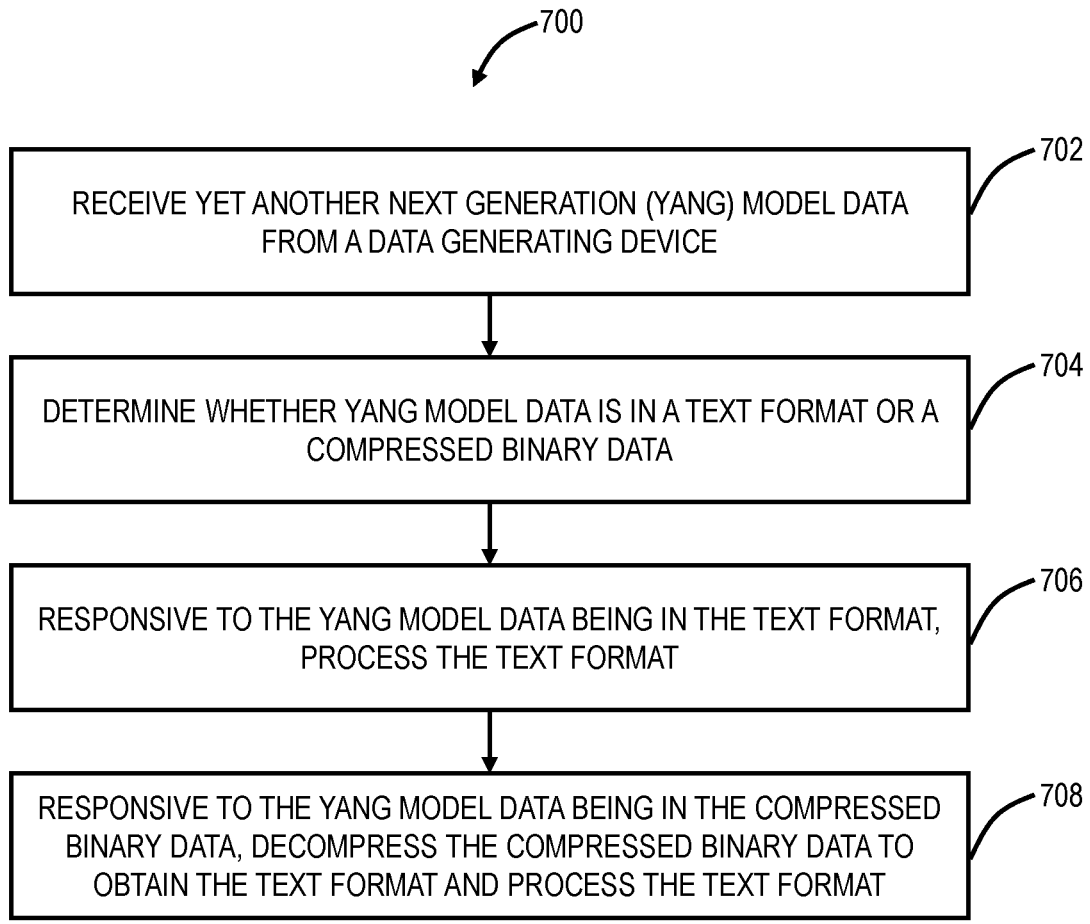
FIG. 7 is a flowchart of a process implemented at a receiving device.

FIG. 7 is a flowchart of a process 700 implemented at a receiving device. The process 700 includes receiving Yet Another Next Generation (YANG) model data from a data generating device (step 702), determining whether YANG model data is in a text format or a compressed binary data (step 704), responsive to the YANG model data being in the text format, processing the text format (step 706), and, responsive to the YANG model data being in the compressed binary data, decompressing the compressed binary data to obtain the text format and processing the text format (step 708).

The process 700 can further include receiving second YANG model data from the data generating device, wherein the second YANG model data is smaller than the YANG model data, and wherein the second YANG model data is in the text format.

It will be appreciated that some embodiments described herein may include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured to," "logic configured to," etc. perform a set of operations, steps, methods, processes, algorithms, functions, techniques, etc. on digital and/or analog signals as described herein for the various embodiments.

Moreover, some embodiments may include a non-transitory computer-readable medium having instructions stored thereon for programming a computer, server, appliance, device, processor, circuit, etc. to perform functions as described and claimed herein. Examples of such non-transitory computer-readable medium include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A non-transitory computer-readable medium having instructions stored thereon for programming a processing device to perform steps of:
    creating a binary type in a Yet Another Next Generation (YANG) model configured to allow either of a text format and a compressed binary format of data to be stored in the same YANG model;
    obtaining data for modeling;
    encoding, to a text section of the YANG model, the obtained data in a text format, the text format being under control of a model header;
    compressing the text format into compressed binary data;
    injecting the compressed binary data in the YANG model to encapsulate the compressed binary data, in a compressed binary format, back into the same YANG model as the text format, the compressed binary format being under control of the model header; and
    transmitting the compressed binary data for the YANG model to a receiving device.

2. The non-transitory computer-readable medium of claim 1, wherein the compressing is performed based on a number of items that are repeated.

3. The non-transitory computer-readable medium of claim 2, wherein the compressing is performed when the text format is on an order of megabytes in size.

4. The non-transitory computer-readable medium of claim 1, wherein the YANG model further specifies a compression format for the compressed binary data.

5. The non-transitory computer-readable medium of claim 1, wherein the instructions are further configured to program the processing device to perform steps of
    obtaining second data for modeling via the YANG model, wherein the second data is smaller than the obtained data;
    encoding the second data in the text format; and
    transmitting the text format for the YANG model to the receiving device.

6. The non-transitory computer-readable medium of claim 1, wherein the data is any of configuration data and operational data for a network element.

7. A data generating device comprising:
    a processor and memory storing instructions that, when executed, cause the processor to
        create a binary type in a Yet Another Next Generation (YANG) model configured to allow either of a text format and a compressed binary format of data to be stored in the same YANG model, obtain data for modeling, encode, to a text section of the YANG model the obtained data in a text format, the text format being under control of a model header, compress the text format into compressed binary data, inject the compressed binary data in the YANG model to encapsulate the compressed binary data, in a compressed binary format, back into the same YANG model as the text format, the compressed binary format being under control of the model header, and transmit the compressed binary data for the YANG model to a receiving device.

8. The data generating device of claim 7, wherein the text format is compressed based on a number of items that are repeated.

9. The data generating device of claim 8, wherein the text format is compressed when the text format is on an order of megabytes in size.

10. The data generating device of claim 7, wherein the YANG model further specifies a compression format for the compressed binary data.

11. The data generating device of claim 7, wherein the instructions that, when executed, further cause the processor to obtain second data for modeling via the YANG model, wherein the second data is smaller than the obtained data, encode the second data in the text format, and transmit the text format for the YANG model to the receiving device.

12. The data generating device of claim 7, wherein the data is any of configuration data and operational data for a network element.

13. A receiving device comprising:

a processor and memory storing instructions that, when executed, cause the processor to receive Yet Another Next Generation (YANG) model data from a data generating device, determine whether YANG model data is in a text format or a compressed binary data, wherein the text format and the compressed binary data, while stored, are under control of a same model header, responsive to the YANG model data being in the text format, process the text format, and responsive to the YANG model data being in the compressed binary data, decompress the compressed binary data to obtain the text format and process the text format, wherein the YANG model data includes the text format or the compressed binary data, such that the text format or the compressed binary data are stored in the same YANG model, and wherein the compressed binary data is in a compressed binary format encapsulates the compressed text format back into the same YANG model.

14. The receiving device of claim 13, wherein the text format in the compressed binary data is compressed by the data generating device based on a number of items that are repeated.

15. The receiving device of claim 14, wherein the text format in the compressed binary data is compressed when the text format is on an order of megabytes in size.

16. The receiving device of claim 13, wherein the YANG model further specifies a compression format for the compressed binary data.

17. The receiving device of claim 13, wherein the YANG model data includes the compressed binary data, and wherein the instructions that, when executed, further cause the processor to receive second YANG model data from the data generating device, wherein the second YANG model data is smaller than the YANG model data, and wherein the second YANG model data is in the text format.

18. The receiving device of claim 13, wherein the data is any of configuration data and operational data for a network element.

* * * * *